United States Patent
Kalnitsky et al.

Patent Number: 6,166,421
Date of Patent: Dec. 26, 2000

[54] POLYSILICON FUSE THAT PROVIDES AN OPEN CURRENT PATH WHEN PROGRAMMED WITHOUT EXPOSING THE FUSE TO THE ENVIRONMENT

[75] Inventors: Alexander Kalnitsky, San Francisco; Albert Bergemont, Palo Alto, both of Calif.

[73] Assignee: National Semiconductor Corporation, Santa Clara, Calif.

[21] Appl. No.: 09/376,226

[22] Filed: Aug. 18, 1999

[51] Int. Cl.[7] .................................................. H01L 29/00
[52] U.S. Cl. ............................................................ 257/529
[58] Field of Search ..................................... 257/209, 529, 257/763, 764; 438/132, 467, 601

[56] References Cited

U.S. PATENT DOCUMENTS

| | | | |
|---|---|---|---|
| 4,209,894 | 7/1980 | Keen | 438/467 |
| 4,503,315 | 3/1985 | Kamioka et al. | 219/121.65 |
| 4,635,091 | 1/1987 | Roger | 257/529 |
| 5,068,706 | 11/1991 | Sugita et al. | 257/529 |
| 5,376,820 | 12/1994 | Crafts et al. | 257/529 |
| 5,899,736 | 5/1999 | Weigand et al. | 438/601 |
| 6,008,716 | 12/1999 | Kokubun | 257/529 |
| 6,080,649 | 6/2000 | Werner et al. | 438/601 |

FOREIGN PATENT DOCUMENTS 0 510 900 A2  10/1992  European Pat. Off. ............... 257/529

OTHER PUBLICATIONS

M. Alavi et al., "A PROM Element Based on Salicide Agglomeration of Poly Fuses in a CMOS Logic Process" IEDM 9 7 (Dec. 1997) pp. 855–858.

*Primary Examiner*—J. Carroll
*Attorney, Agent, or Firm*—Limbach & Limbach L.L.P.

[57] ABSTRACT

The contamination introduced into a conventional fuse via the window opening of the fuse is eliminated by forming a fuse with a cavity. When the fuse is programmed by passing a current through the fuse which is sufficient to heat up the fuse material, the heated fuse material flows up into the cavity, thereby providing an open current path.

20 Claims, 6 Drawing Sheets

POLYSILICON FUSE THAT PROVIDES AN OPEN CURRENT PATH WHEN PROGRAMMED WITHOUT EXPOSING THE FUSE TO THE ENVIRONMENT

BACKGROUND OF THE INVENTION

1. Field of the Invention

The present invention relates to semiconductor fuses and, more particularly, to a semiconductor fuse that provides an open current path when programmed without exposing the fuse to the environment.

2. Description of the Related Art

A semiconductor fuse is a device that provides a low-resistance current path between two conductive lines when the fuse is unprogrammed, and a highresistance current path between the two conductive lines when the fuse is programmed.

FIG. 1A shows a plan view that illustrates a conventional semiconductor fuse 100. FIG. 1B shows a cross-sectional diagram taken along line 1B—1B of FIG. 1A. As shown in FIGS. 1A and 1B, fuse 100, which is formed on a first layer of isolation material 110, includes a strip of doped polysilicon (poly) 112 which is formed on isolation layer 110.

As further shown in FIGS. 1A and 1B, fuse 100 also includes a second layer of isolation material 114 which is formed on poly strip 112. Isolation layer 114, in turn, has a number of openings at each end of poly strip 112 that expose a corresponding number of regions on the surface of poly strip 112.

In addition, fuse 100 further includes a number of contacts 116 which are formed in the openings in isolation layer 114 to be electrically connected to poly strip 112. Fuse 100 also includes a first metal line ML1 which is formed on isolation layer 114 to be electrically connected to the contacts 116 at one end of poly strip 112, and a second metal line ML2 which is formed on isolation layer 114 to be electrically connected to the contacts at the other end of poly strip 112.

Fuse 100 further includes a third layer of isolation material 120 (not shown in FIG. 1A) which is formed on isolation layer 114 and metal lines ML1 and ML2. In addition, a window opening 122 is formed in isolation layers 114 and 120 to expose the top surface of poly strip 112. (One common variation is to form a thin layer of oxide 124 on the exposed top surface of poly strip 112 as shown by the dashed line in FIG. 1B.)

In operation, in the native or unprogrammed state, which is shown in FIGS. 1A and 1B, fuse 100 provides a low-resistance current path between metal lines ML1 and ML2. When programmed, however, a portion of fuse 100 is removed which, in turn, provides an open current path between metal lines ML1 and ML2.

Fuse 100 is programmed by applying a voltage drop across metal lines ML1 and ML2 which causes a programming current to flow from metal line ML1 through poly strip 112 to metal line ML2. The programming current must have a magnitude which is sufficient to heat poly strip 112 to approximately 1400° C.

At this temperature, the portion of poly strip 112 exposed by window opening 122 boils away, escaping through window opening 122. The process is self limiting in that when enough polysilicon has boiled away to open the current path, the programming current ceases to flow through poly strip 112, thereby removing the source of heat.

FIG. 2 shows a cross-sectional diagram that illustrates fuse 100 after fuse 100 has been programmed. As shown in FIG. 2, poly strip 112 is broken into two electrically disconnected strips 112A and 112B as a result of the programming current passing through poly strip 112.

(When oxide layer 124 is formed on the exposed top surface of poly strip 112, the heating causes oxide layer 124 to crack which, in turn, provides a path for the polysilicon to escape.)

One of the disadvantages of fuse 100 is that poly strip 112 (or oxide layer 124) and the adjacent circuitry is exposed to the outside environment via window opening 122. As a result of this exposure, fuse 100 and the adjacent circuitry is subject to contamination from the outside environment.

To eliminate this source of contamination, other approaches for forming fuses have also been developed which do not rely on the removal of a portion of poly strip 112. One of these other approaches uses a strip of material 112 which, when heated, changes from a low-resistivity state to a high-resistivity state.

FIG. 3A shows a cross-sectional diagram that illustrates a conventional unprogrammed fuse 300 which changes resistivity states when heated. FIG. 3B shows a cross-sectional diagram that illustrates fuse 300 after fuse 300 has been programmed. Fuse 300 is similar to fuse 100 and, as a result, utilizes the same reference numerals to designate the structures which are common to both fuses. As shown in FIGS. 3A–3B, fuse 300 differs from fuse 100 in that fuse 300 has no window opening formed in isolation layer 120, but instead has a layer of silicide 310 formed on the top surface of poly strip 112. When unprogrammed, silicide layer 310 reduces the resistivity of poly strip 112.

On the other hand, when poly strip 112 and silicide layer 310 are heated to a mixing temperature via a programming current, the chemical reaction between the polysilicon and the silicide forms an agglomeration 312 which is significantly more resistant to current flow than the silicided poly strip.

One of the disadvantages of fuse 300 is that, although fuse 300 eliminates window opening 122, fuse 300 provides a high-resistance current path rather than an open current path. Although the current flowing through fuse 300 when fuse 300 is programmed is very small, there is always a desire to further minimize power consumption for battery-powered devices. Another disadvantage of fuse 300 is that the inclusion of silicide layer 310 increases the fabrication cost of fuse 300.

As a result, there is a need for a fuse which eliminates window opening 122 while at the same time providing an open current path after programming.

SUMMARY OF THE INVENTION

The present invention provides a fuse which eliminates the window opening of conventional fuses by utilizing a cavity which is capable of collecting a portion of the fuse material which is heated during programming, thereby providing an open current path.

In accordance with the present invention, a fuse, which is formed on a first layer of isolation material, includes a strip of conductive material which is formed on the first layer of isolation material, and a second layer of isolation material which is formed on the strip of conductive material.

The second layer of isolation material has a plurality of openings at each end of the strip of conductive material. The plurality of openings at a first end of the strip of conductive material include a large opening and a plurality of smaller openings.

The fuse of the present invention also includes a plurality of contacts that are formed in the plurality of openings to be electrically connected to the strip of conductive material. The plurality of contacts at the first end including a plurality of sidewall contacts which are formed along the sidewalls of the large opening and a plurality of plug contacts formed in the smaller openings.

The fuse of the present invention further includes a first conductive line which is formed on the second layer of isolation material to be electrically connected to the contacts at the first end of the strip of conductive material, and a second conductive line which is formed on the second layer of isolation material to be electrically connected to the contacts at a second end of strip of conductive material. The second conductive line is spaced apart from the first conductive line.

The fuse of the present invention additionally includes a first cavity which is formed between the sidewall contacts in the large opening, and below the first conductive line.

A better understanding of the features and advantages of the present invention will be obtained by reference to the following detailed description and accompanying drawings which set forth an illustrative embodiment in which the principles of the invention are utilized.

DETAILED DESCRIPTION

Figure 1A:
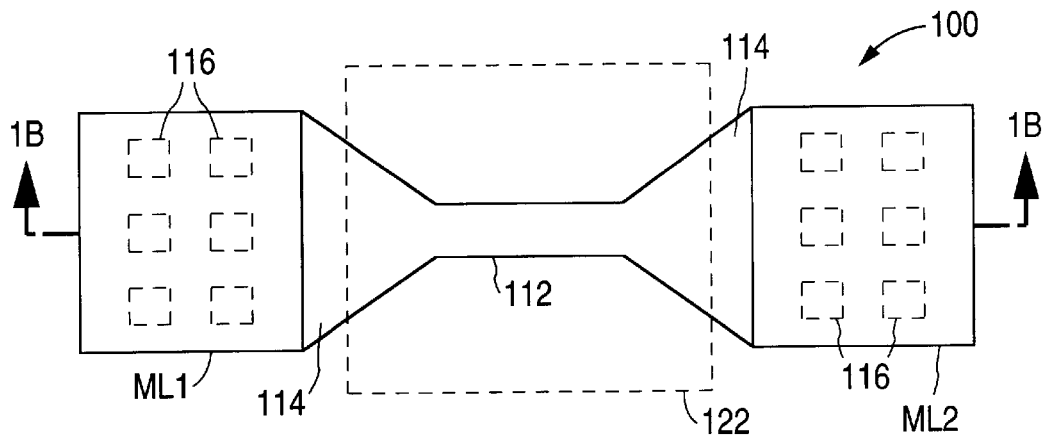
FIG. 1A is a plan view illustrating a conventional semiconductor fuse 100.
Figure 1B:
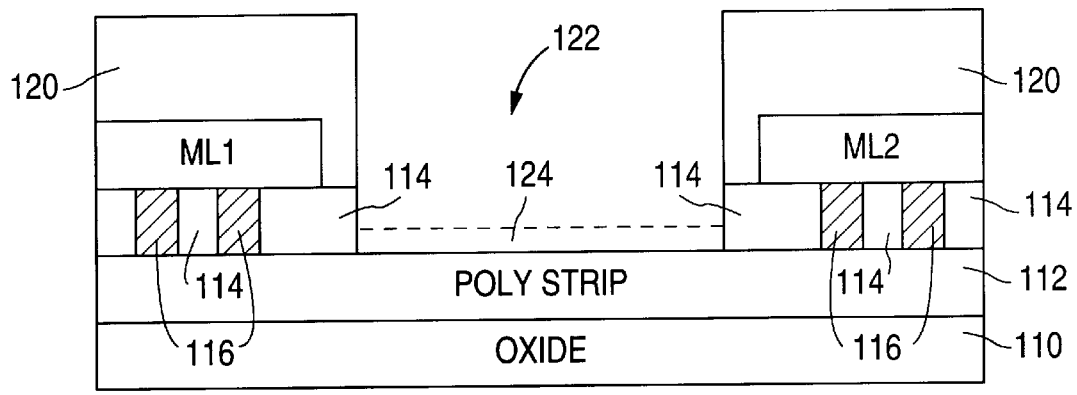
FIG. 1B is a cross-sectional diagram taken along line 1B—1B of FIG. 1A.
Figure 2:
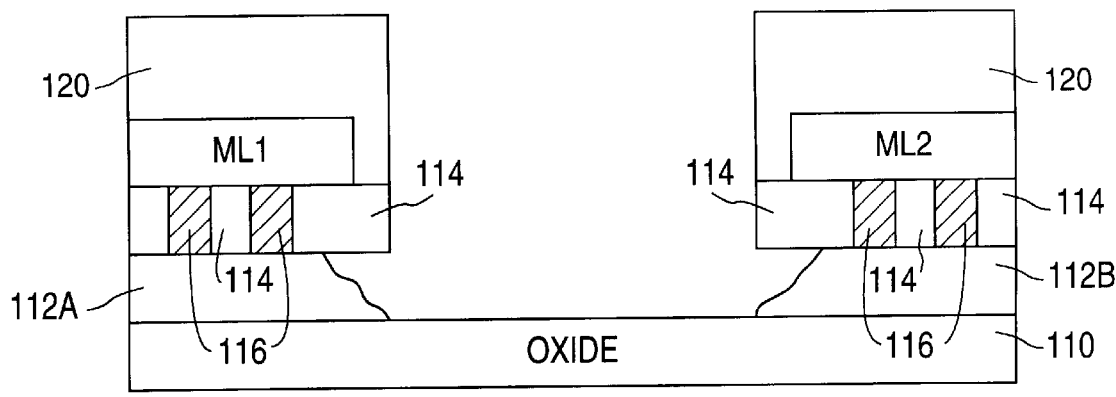
FIG. 2 is a cross-sectional diagram illustrating fuse 100 after fuse 100 has been programmed.
Figure 3A:
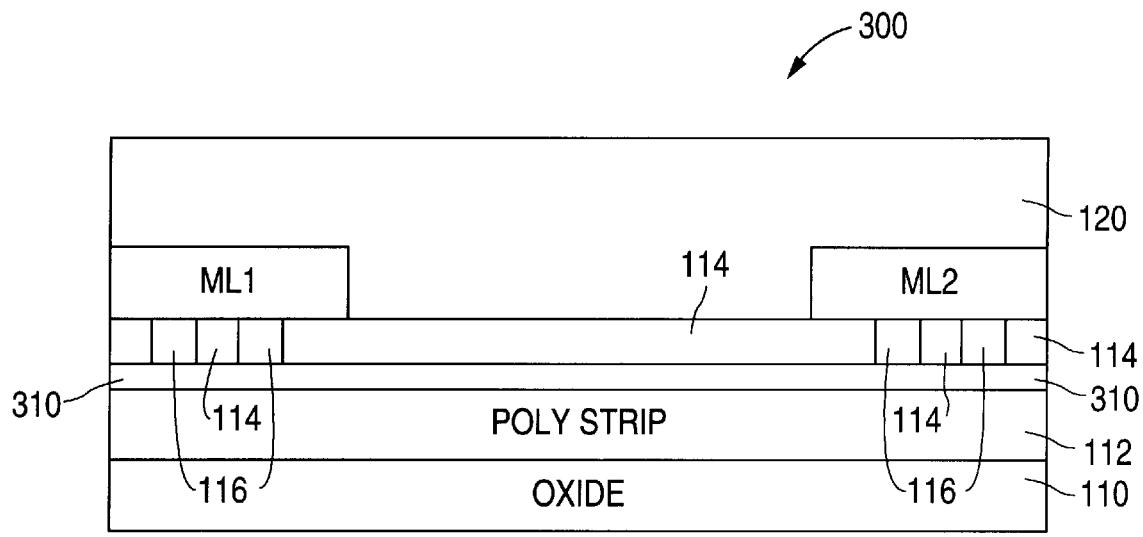
FIG. 3A is a cross-sectional diagram illustrating a conventional unprogrammed fuse 300 which changes resistivity states when heated.
Figure 3B:
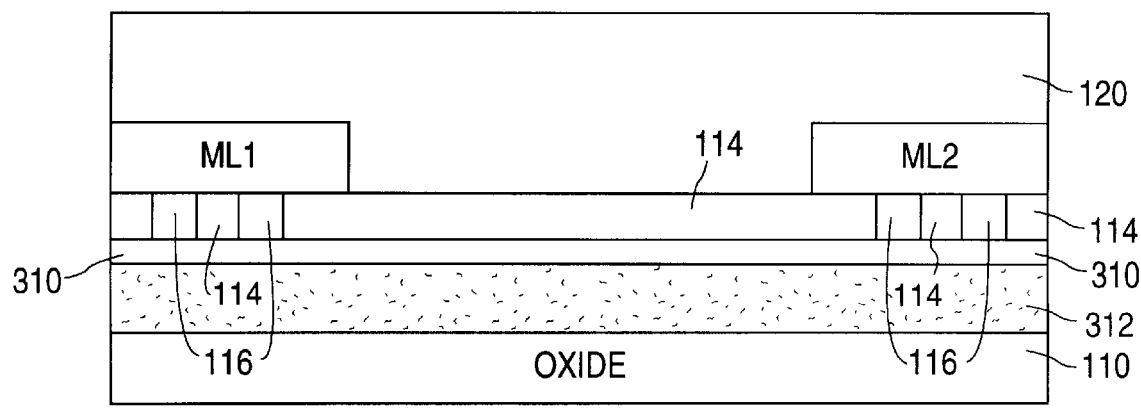
FIG. 3B is a cross-sectional diagram illustrating fuse 300 after fuse 300 has been programmed.
Figure 4A:
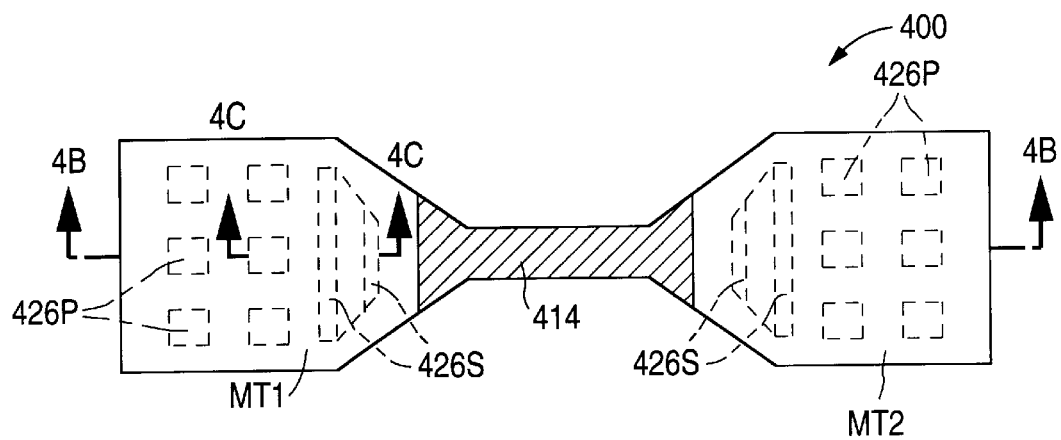
FIG. 4A is a plan view illustrating a fuse 400 in accordance with the present invention.

FIG. 4A shows a plan view that illustrates a fuse 400 in accordance with the present invention. FIG. 43 shows a cross-sectional view of fuse 400 taken along line 4B—4B of FIG. 4A. FIG. 4C shows a cross-sectional diagram taken along line 4C—4C of FIG. 4A.

As described in greater detail below, fuse 400 forms an open current path during programming without a window opening by utilizing a cavity which is capable of receiving enough polysilicon to open the current path.

Figure 4B:
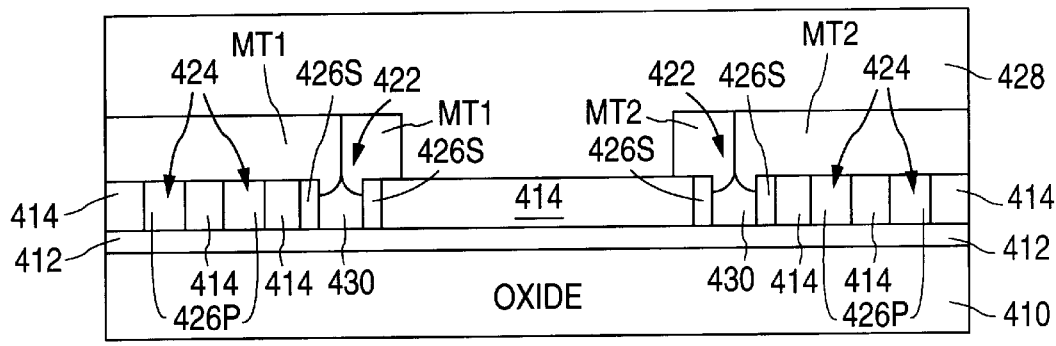
FIG. 4B is a cross-sectional view of fuse 400 taken along line 4B—4B of FIG. 4A.
Figure 4C:
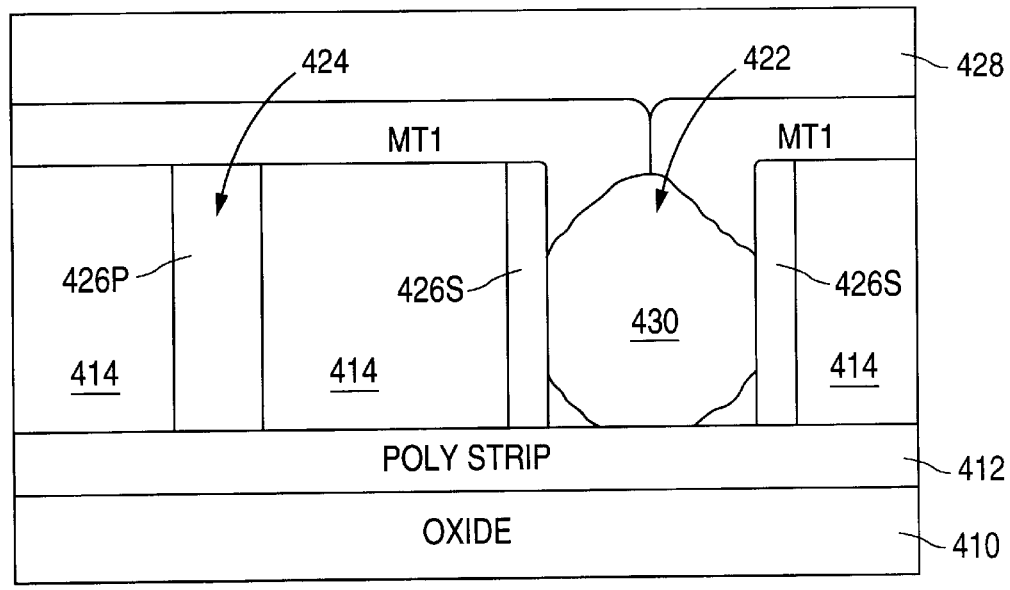
FIG. 4C is a cross-sectional diagram taken along line 4C—4C of FIG. 4A.

As shown in FIGS. 4A–4C, fuse 400, which is formed on a first layer of isolation material 410, such as a layer of oxide, includes a strip of doped polysilicon (poly) 412 which is formed on isolation layer 410. (Poly strip 412 has to be doped. Doping lowers the resistivity of strip 412 which, in turn, increases the magnitude of the programming current that is required to heat strip 412.) As further shown in FIGS. 4A–4C, fuse 400 also includes a second layer of isolation material 414, such as an oxide, which is formed on poly strip 412. Isolation layer 414, in turn, has a number of openings at each end of poly strip 412 that expose a corresponding number of regions on the surface of poly strip 412. In accordance with the present invention, the openings in isolation layer 414 at each end of poly strip 412 include a large opening 422 and a number of smaller openings 424.

Fuse 400 additionally includes a plurality of contacts that include sidewall contacts 426S which are formed along the sidewalls of large opening 422 and a number of plug contacts 426P which are formed in the smaller openings 424. Contacts 426S and 426P are formed in openings 422 and 424, respectively, at each end of poly strip 412 to be electrically connected to poly strip 412.

Fuse 400 additionally includes a first metal line MT1 which is formed on isolation layer 414 to be electrically connected to the contacts 426S and 426P at one end of poly strip 412, and a second metal line MT2 which is formed on isolation layer 414 to be electrically connected to the contacts 426S and 426P at the other end of poly strip 412. Fuse 400 further includes a third layer of isolation material 428 (not shown in FIG. 4A, which is formed on isolation layer 414 and metal lines MT1 and MT2.

In further accordance with the present invention, fuse 400 includes cavities 430 which are formed in the large openings 422 between the sidewall contacts 426S, and below metal lines MT1 or MT2. (Cavity 430 may alternately have a small opening on top which is plugged by the third layer of isolation material 428. In addition, although a pair of cavities are shown, fuse 100 may alternately be formed with only a single cavity at one end of poly strip 412.)

In operation, in the native or unprogrammed state, which is shown in FIGS. 4A, 4B, and 4C, fuse 400 provides a low-resistance current path between metal lines MT1 and MT2. When programmed, however, a portion of fuse 400 is removed which, in turn, provides an open current path between metal lines MT1 and MT2.

Fuse 400 is programmed by applying a voltage drop across metal lines MT1 and MT2 which causes a programming current to flow from metal line MT1 through poly strip 412 to metal line MT2. The programming current must have a magnitude which is sufficient to heat poly strip 412 to approximately 1400° C.

As described in greater detail below, when the metal layer seals the top of cavity 430, cavity 430 is formed with the same evacuated pressure that is used during the deposition of the metal layer. (When a small opening exists at the top of cavity 430 which is plugged by isolation layer 428, cavity 430 is formed with the same evacuated pressure that is used during the deposition of isolation layer 428.) Thus, when poly strip 412 is sufficiently heated, polysilicon from strip 412 expands and is sucked into cavity 430.

The programming process is self limiting in that when enough polysilicon has flowed into cavity 430 to open the current path, the programming current ceases to flow through poly strip 412, thereby removing the source of heat.

In addition, heated polysilicon is a very viscous material. As a result, when the source of the heat is removed and the temperature begins to fall, the polysilicon in cavity 430 does not reflow into poly strip 412, but instead solidifies with little change in shape.

Figure 5A:
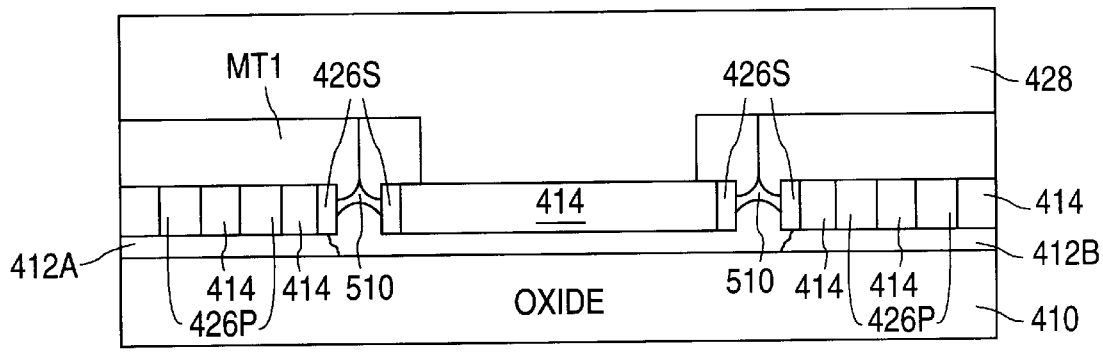
FIG. 5A is a cross-sectional diagram taken along line 4B—4B of FIG. 4A illustrating fuse 400 after fuse 400 has been programmed.
Figure 5B:
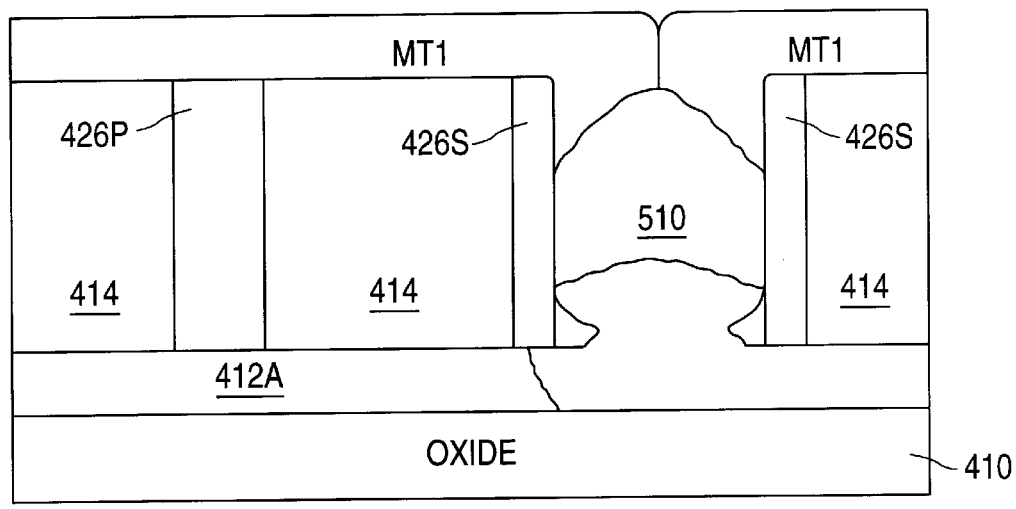
FIG. 5B is a cross-sectional diagram taken along line 4C—4C of FIG. 4A illustrating fuse 400 after fuse 400 has been programmed.

FIG. 5A shows a cross-sectional diagram taken along line 4B—4B of FIG. 4A that illustrates fuse 400 after fuse 400 has been programmed. FIG. 5B shows a cross-sectional diagram taken along line 4C—4C of FIG. 4A that illustrates fuse 400 after fuse 400 has been programmed.

As shown in FIGS. 5A and 5B, as a result of the programming current passing through poly strip 412, poly strip 412 is broken into two electrically disconnected strips 412A and 412B (with a discontinuity near the center) with the polysilicon forming a poly region 510 on the bottom surfaces of metal lines MT1 and MT2 in the large openings 422.

Thus, in accordance with the present invention, a fuse has been described which eliminates the need for a window opening while at the same time providing an open current path after programming by utilizing cavities which are capable of receiving enough polysilicon to open the current path.

Figure 6:
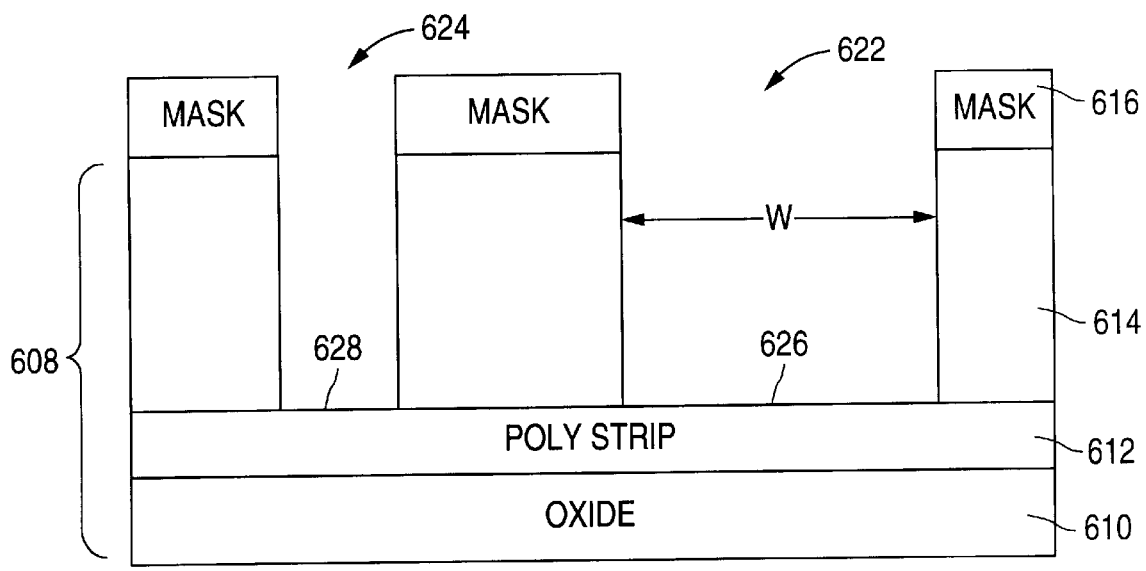
FIGS. 6–10 are a series of cross-sectional views taken along lines 4C—4C of FIG. 4A that illustrate a method for forming fuse 400 in accordance with the present invention.

FIGS. 6–10 show a series of cross-sectional views taken along lines 4C—4C of FIG. 4A that illustrate a method for forming fuse 400 in accordance with the present invention. As shown in FIG. 6, the method of the present invention begins with the conventional formation of a base structure 608 which includes a first layer of isolation material 610, such as an oxide, a strip of doped polysilicon (poly) 612 which is formed on isolation layer 610, and a second layer of isolation material 614, such as an oxide, which is formed on poly layer 612.

Poly strip 612, which is the same as poly strip 412, has a conventional area and footprint and can be formed during the same steps that are used to form the gates of the transistors in the adjacent circuitry. Isolation layer 614, which is the same as isolation layer 414, can be formed at the same time that the isolation layer is formed over the transistors in the adjacent circuitry.

To base structure 608, a contact mask 616 is formed and patterned on isolation layer 614. Isolation layer 614 is then etched to form a number of openings in isolation layer 614 that expose a corresponding number of regions on the surface of poly strip 612 at each end of poly strip 612. Following this, contact mask 616 is removed.

In accordance with the present invention, the number of openings at each end of poly strip 612 include a large opening 622 and a number of smaller openings 624 which, in turn, expose a large region 626 and a number of smaller regions 628 on the surface of poly strip 612.

The maximum width W of the large openings 622, less the widths of the to-be-formed sidewall contacts, is just less than a width that would allow a subsequently deposited layer of metal, such as aluminum or copper, to fill up the large openings 622. By defining the maximum width W in this manner, the subsequently deposited layer of metal will always form a cavity between the to-be-formed sidewall contacts in the large openings 622.

The actual length and width of the large openings 622 are then set to insure that the resulting cavities have a sufficient volume to accommodate the to-be-removed volume of polysilicon. The size and number of the smaller openings and regions 624 and 628 are selected so that the to-be-formed contacts provide a low-resistance current path between the metal lines MT1 and MT2 and poly strip 612.

Figure 7:
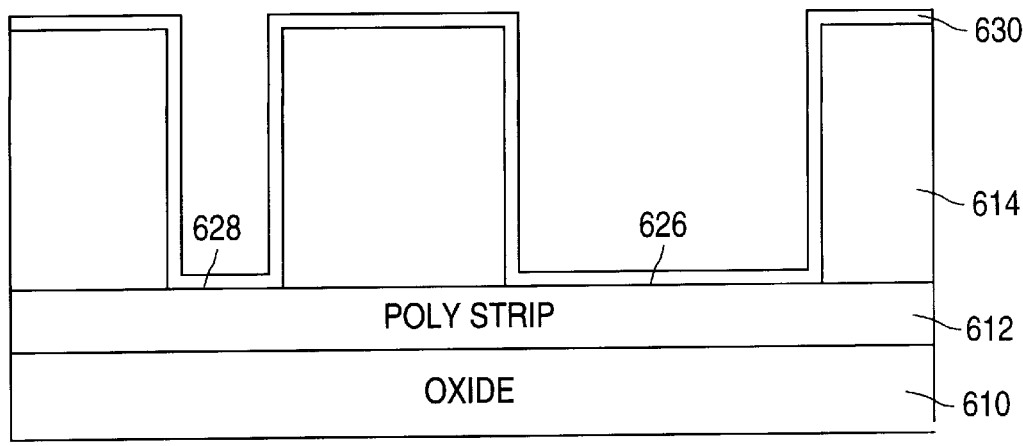

Next, as shown in FIG. 7, a layer of liner material 630 is formed on the top and sidewall surfaces of isolation layer 614, and over regions 626 and 628 on the surface of poly strip 612. The layer of liner material 630 prevents or substantially reduces the interaction between the material used to form the contacts and the polysilicon in strip 612.

Liner layer 630 can be formed, for example, by depositing a layer of titanium (Ti) on the top and sidewall surfaces of isolation layer 614, and over regions 626 and 628 on the surface of poly strip 612. This is then followed by the deposition of a layer of titanium nitride (TiN) on the Ti layer.

Figure 8:
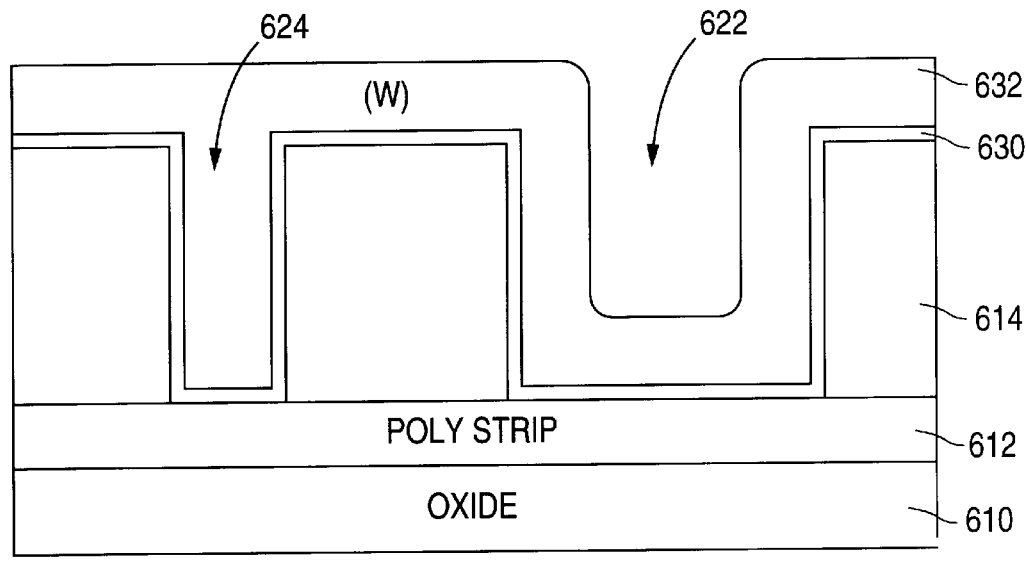
Figure 9:
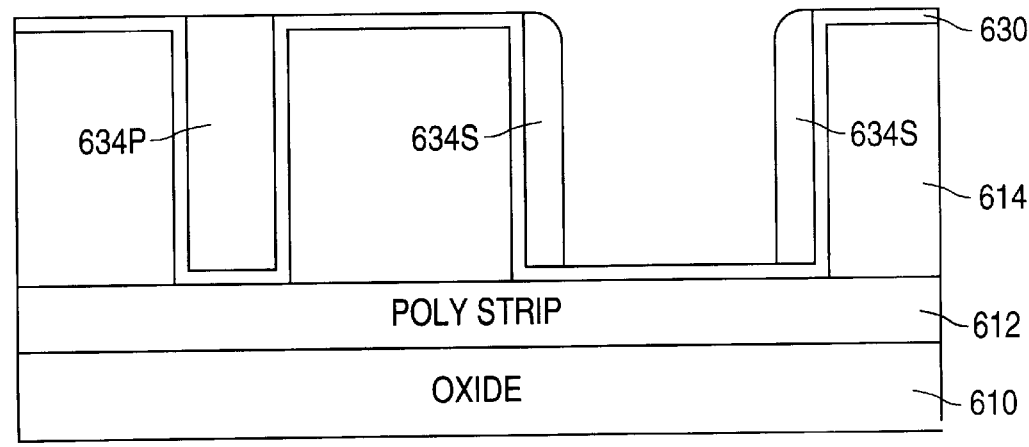

As shown in FIG. 8, once liner layer 630 has been formed, a layer of contact material 632, such as tungsten (W), is deposited on liner layer 630 to fill up the smaller openings 624. Next, as shown in FIG. 9, the layer of contact material 632 is etched back to form sidewall contacts 634S along the sidewalls of large opening 622, and plug contacts 634P in the smaller openings 624. Thus, sidewall contacts 426S and plug contacts 426P can include a region of contact material formed over a layer of liner material.

Sidewall contacts 634S and plug contacts 634P can be formed during the same processing steps that are used to form the contacts that electrically connect the traces of a to-be-formed metal-1 layer to the terminals of the transistors in the adjacent circuitry.

Figure 10:
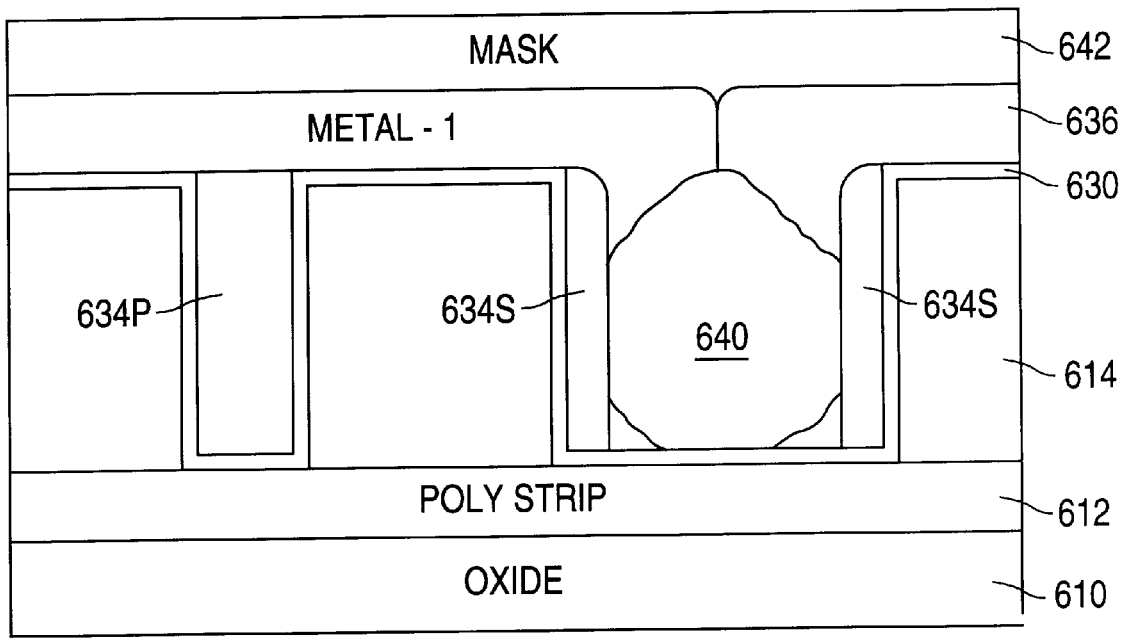

As shown in FIG. 10, once contacts 634S and 634P have been formed, a layer of metal (metal-1) 636, such as aluminum or copper, is deposited on sidewall contacts 634S and plug contacts 634P at an evacuated pressure. In accordance with the present invention, metal-1 layer 636 forms cavities 640, which are the same as cavities 430 which have the evacuated pressure, between the sidewall contacts 634S in the large openings 622. Once metal-1 layer 636 has been formed, a metal-1 mask 642 is formed and patterned on metal-1 layer 636.

Figure 11:
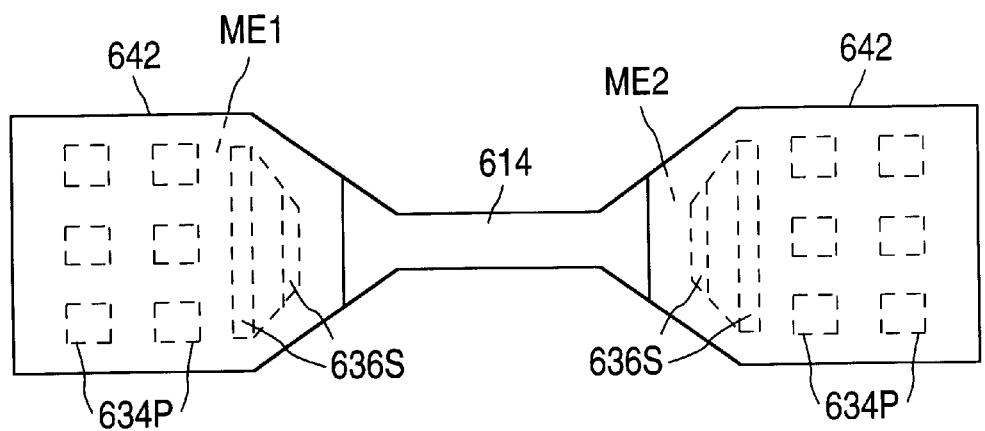
FIG. 11 is a plan view illustrating fuse 400 once metal-1 layer 636 has been etched.

The unmasked regions of metal-1 layer 636 and underlying liner layer 630 are then etched to form a first metal line ME1 which is connected to the contacts 634S and 634P at one end of poly strip 612, and a second metal line ME2 which is connected to the contacts 634S and 634P at the other end of poly strip 612. FIG. 11 shows a plan view that illustrates fuse 400 after metal-1 layer 636 has been etched.

After this, metal-1 mask 642 is removed, and the process continues with conventional steps. Thus, metal lines MT1 and MT2 can include a layer of metal formed over a layer of liner material. Metal line ME1 and ME2 can be formed at the same time that metal lines are formed to be electrically connected to the contacts in the adjacent circuitry.

Thus, one of the advantages of the present invention is that fuse 400 can be formed in a conventional process without any additional process steps. The only additional requirement is that the contact mask be altered to form the large openings in the second isolation layer.

It should be understood that various alternatives to the embodiment of the invention described herein may be employed in practicing the invention. Thus, it is intended that the following claims define the scope of the invention and that methods and structures within the scope of these claims and their equivalents be covered thereby.

What is claimed is:

1. A semiconductor fuse formed on a first layer of isolation material, the fuse comprising:

a strip of conductive material formed on the first layer of isolation material;

a second layer of isolation material formed on the strip of conductive material, the second layer of isolation material having a plurality of openings at each end of the strip of conductive material, the plurality of openings at a first end of the strip of conductive material including a large opening and a plurality of smaller openings;

a plurality of contacts that are formed in the plurality of openings to be electrically connected to the strip of conductive material, the plurality of contacts at the first end including a plurality of sidewall contacts formed along the sidewalls of the large opening and a plurality of plug contacts formed in the smaller openings;

a first conductive line formed on the second layer of isolation material to be electrically connected to the contacts at the first end of the strip of conductive material;

a second conductive line formed on the second layer of isolation material to be electrically connected to the contacts at a second end of strip of conductive material, the second conductive line being spaced apart from the first conductive line; and a first cavity formed between the sidewall contacts in the large opening, and below the first conductive line.

2. The fuse of claim 1 wherein the strip of conductive material is doped polysilicon.

3. The fuse of claim 2 wherein each contact includes:

a layer of liner material formed over the sidewall surfaces of the second layer of isolation material, and the top surface of the strip of conductive material; and a region of contact material formed on the layer of liner material.

4. The fuse of claim 3 wherein the layer of liner material is titanium nitride over titanium.

5. The fuse of claim 4 wherein the region of contact material is tungsten.

6. The fuse of claim 3 wherein the first and second conductive lines include metal.

7. The fuse of claim 3 wherein the first and second conductive lines include metal over the layer of liner material formed over the second layer of isolation material.

8. The fuse of claim 1 wherein the plurality of openings in the second layer of isolation material at the second end of the strip of conductive material include a large opening and a plurality of smaller openings;

wherein the plurality of contacts at the second end include a plurality of sidewall contacts formed along the sidewalls of the large opening at the second end, and a plurality of plug contacts formed in the smaller openings at the second end; and further comprising a second cavity formed between the sidewall contacts in the large opening at the second end, and below the second conductive line.

9. The fuse of claim 8 wherein the strip of conductive material is doped polysilicon.

10. The fuse of claim 9 wherein each contact includes:

a layer of liner material formed over the sidewall surfaces of the second layer of isolation material, and the top surface of the strip of conductive material; and a region of contact material formed on the layer of liner material.

11. The fuse of claim 10 wherein the layer of liner material is titanium nitride over titanium.

12. The fuse of claim 11 wherein the region of contact material is tungsten.

13. The fuse of claim 12 wherein the first and second conductive lines include metal.

14. The fuse of claim 12 wherein the first and second conductive lines include metal over the layer of liner material formed over the second layer of isolation material.

15. The fuse of claim 1 and further comprising a third layer of isolation material formed on the second layer of isolation material and the first and second conductive lines.

16. A semiconductor fuse formed on a first layer of isolation material, the fuse comprising:

a first strip of conductive material formed on the first layer of isolation material;

a second strip of conductive material formed on the first layer of isolation material, the first and second strips being spaced apart;

a second layer of isolation material formed on the first and second strips of conductive material, the second layer of isolation material having a plurality of openings over the first strip of conductive material and over the second strip of conductive material, the plurality of openings over the first strip of conductive material including a large opening and a plurality of smaller openings;

a plurality of contacts that are formed in the plurality of openings to be electrically connected to the first and second strips of conductive material, the plurality of contacts connected to the first strip of conductive material including a plurality of sidewall contacts formed along the sidewalls of the large opening and a plurality of plug contacts formed in the smaller openings;

a first conductive line formed on the second layer of isolation material to be electrically connected to the contacts connected to the first strip of conductive material;

a second conductive line formed on the second layer of isolation material to be electrically connected to the contacts connected to the second strip of conductive material, the second conductive line being spaced apart from the first conductive line;

a first cavity formed in the large opening between the sidewall contacts, and below the first conductive line;

a third layer of isolation material formed on the second layer of isolation material and the first and second conductive lines; and a region of conductive material connected to a bottom surface of the first conductive line.

17. A method for programming a semiconductor fuse formed on a first layer of isolation material, the fuse comprising:

a strip of conductive material formed on the first layer of isolation material;

a second layer of isolation material formed on the strip of conductive material, the second layer of isolation material having a plurality of openings at each end of the strip of conductive material, the plurality of openings at a first end of the strip of conductive material including a large opening and a plurality of smaller openings;

a plurality of contacts that are formed in the plurality of openings to be electrically connected to the strip of conductive material, the plurality of contacts at the first end including a plurality of sidewall contacts formed along the sidewalls of the large opening and a plurality of plug contacts formed in the smaller openings;

a first conductive line formed on the second layer of isolation material to be electrically connected to the contacts at the first end of the strip of conductive material;

a second conductive line formed on the second layer of isolation material to be electrically connected to the contacts at a second end of strip of conductive material, the second conductive line being spaced apart from the first conductive line;

a first cavity formed between the sidewall contacts in the large opening, and below the first conductive line; and a third layer of isolation material formed on the second layer of isolation material and the first and second conductive lines, the method comprising the step of applying a voltage drop across the first and second conductive lines which causes a current to flow through the strip of conductive material, the current having a magnitude sufficient to heat the strip of conductive material so that a portion of the strip of conductive material flows up into the first cavity.

18. The method of claim 17 wherein the plurality of openings in the second layer of isolation material at the second end of the strip of conductive material include a large opening and a plurality of smaller openings;

wherein the plurality of contacts at the second end include a plurality of sidewall contacts formed along the sidewalls of the large opening at the second end, and a plurality of plug contacts formed in the smaller openings at the second end; and further comprising a second cavity formed between the sidewall contacts in the large opening at the second end, and below the second conductive line.

19. The method of claim 18 wherein the current heats the strip of conductive material so that a portion of the strip of conductive material flows up into the second cavity.

20. A method for forming a semiconductor fuse on a base structure, the base structure having:

a first layer of isolation material;

a strip of conductive material formed on the first layer of isolation material; and a second layer of isolation material formed on the strip of conductive material, the method comprising the steps of:

forming a plurality of openings in the second layer of isolation material at each end of the strip of conductive material that expose a plurality of regions on the surface of the strip of conductive material, the plurality of openings at a first end of the strip of conductive material including a large opening and a plurality of smaller openings;

forming a layer of liner material on the top and sidewall surfaces of the second layer of isolation material, and on the plurality of exposed regions on the surface of the strip of conductive material;

forming a layer of contact material on the layer of liner material to fill up the plurality of openings;

etching back the layer of contact material to form contacts, at the first end the contacts including sidewall contacts formed along the sidewalls of the large opening, and plug contacts formed in the smaller openings; and depositing a layer of metal on the layer of liner material, the sidewall contacts, and the plug contacts to form a cavity in the large opening between the sidewall contacts, and below the layer of metal.

* * * * *